United States Patent
Huang et al.

(10) Patent No.: US 9,859,462 B2
(45) Date of Patent: Jan. 2, 2018

(54) SEMICONDUCTOR STRUCTURE

(71) Applicant: Genesis Photonics Inc., Tainan (TW)

(72) Inventors: Chi-Feng Huang, Tainan (TW); Sheng-Han Tu, Tainan (TW)

(73) Assignee: Genesis Photonics Inc., Tainan (TW)

(*) Notice: Subject to any disclaimer, the term of this patent is extended or adjusted under 35 U.S.C. 154(b) by 0 days.

(21) Appl. No.: 14/940,173

(22) Filed: Nov. 13, 2015

(65) Prior Publication Data
US 2016/0072009 A1    Mar. 10, 2016

Related U.S. Application Data

(63) Continuation of application No. 13/917,645, filed on Jun. 14, 2013, now abandoned.

(30) Foreign Application Priority Data

Dec. 6, 2012    (TW) .............................. 101145835 A

(51) Int. Cl.
*H01L 33/06* (2010.01)
*H01L 33/12* (2010.01)
(Continued)

(52) U.S. Cl.
CPC .......... *H01L 33/12* (2013.01); *H01L 21/0251* (2013.01); *H01L 21/0254* (2013.01);
(Continued)

(58) Field of Classification Search
CPC ............ H01L 21/0238; H01L 33/0095; H01L 21/2654; H01L 23/3735; H01L 29/7783; H01L 33/06; H01L 33/007
See application file for complete search history.

(56) References Cited

U.S. PATENT DOCUMENTS 5,606,185 A    2/1997  Nguyen et al.
5,874,747 A *  2/1999  Redwing ............... H01L 33/007
                                                       257/103
(Continued)

FOREIGN PATENT DOCUMENTS

CN    1431722    7/2003
CN    1505843    6/2004
(Continued)

OTHER PUBLICATIONS

"First Office Action of Related U.S. Appl. No. 14/459,335", dated Feb. 18, 2015, p. 1-p. 17.
(Continued)

*Primary Examiner* — Fang-Xing Jiang
(74) *Attorney, Agent, or Firm* — JCIPRNET

(57) ABSTRACT

A semiconductor structure includes a silicon substrate, an aluminum nitride layer and a plurality of grading stress buffer layers. The aluminum nitride layer is disposed on the silicon substrate. The grading stress buffer layers are disposed on the aluminum nitride layer. Each grading stress buffer layer includes a grading layer and a transition layer stacked up sequentially. A chemical formula of the grading layer is $Al_{1-x}Ga_xN$, wherein the x value is increased from one side near the silicon substrate to a side away from the silicon substrate, and $0 \leq x \leq 1$. A chemical formula of the transition layer is the same as the chemical formula of a side surface of the grading layer away from the silicon substrate. The chemical formula of the transition layer of the grading stress buffer layer furthest from the silicon substrate is GaN.

20 Claims, 3 Drawing Sheets

(51) Int. Cl.
  *H01L 29/201* (2006.01)
  *H01L 21/02* (2006.01)
  *H01L 33/32* (2010.01)
  *H01L 29/20* (2006.01)
  *H01L 33/00* (2010.01)

(52) U.S. Cl.
  CPC .. *H01L 21/02381* (2013.01); *H01L 21/02458* (2013.01); *H01L 21/02505* (2013.01); *H01L 29/201* (2013.01); *H01L 33/06* (2013.01); *H01L 33/32* (2013.01); *H01L 29/2003* (2013.01); *H01L 33/007* (2013.01)

(56) References Cited

U.S. PATENT DOCUMENTS

| | | | |
|---|---|---|---|
| 6,459,100 | B1 | 10/2002 | Doverspike et al. |
| 6,956,250 | B2 * | 10/2005 | Borges ............... H01L 23/3735 257/103 |
| 7,030,428 | B2 * | 4/2006 | Saxler ............... H01L 29/7783 257/190 |
| 7,943,406 | B2 * | 5/2011 | Slater, Jr. ........... H01L 21/2654 438/39 |
| 7,994,539 | B2 | 8/2011 | Nam |
| 2003/0020061 | A1 | 1/2003 | Emerson et al. |
| 2005/0029533 | A1 * | 2/2005 | Wu ..................... H01L 33/0095 257/99 |
| 2008/0149918 | A1 | 6/2008 | Yoo et al. |
| 2009/0224226 | A1 * | 9/2009 | Huang ................ H01L 33/06 257/13 |
| 2011/0056429 | A1 | 3/2011 | Raring et al. |
| 2011/0140083 | A1 | 6/2011 | Driscoll et al. |
| 2011/0140118 | A1 * | 6/2011 | Ramdani ........... H01L 21/02381 257/66 |
| 2011/0140173 | A1 | 6/2011 | Ramdani |
| 2012/0074385 | A1 | 3/2012 | Tak et al. |
| 2012/0138945 | A1 | 6/2012 | Chen et al. |
| 2013/0200495 | A1 | 8/2013 | Keller et al. |
| 2013/0329760 | A1 | 12/2013 | Bhat et al. |
| 2014/0045284 | A1 | 2/2014 | Tak et al. |
| 2014/0097443 | A1 | 4/2014 | Fang et al. |
| 2014/0158984 | A1 | 6/2014 | Huang et al. |

FOREIGN PATENT DOCUMENTS

| | | |
|---|---|---|
| CN | 1641900 | 7/2005 |
| CN | 101267008 | 9/2008 |
| CN | 101527341 | 9/2009 |
| CN | 101626058 | 1/2010 |
| CN | 101685844 | 3/2010 |
| CN | 101740691 | 6/2010 |
| CN | 102136536 | 7/2011 |
| CN | 103022290 | 4/2013 |
| CN | 103178175 | 6/2013 |
| EP | 2498293 | 9/2012 |
| JP | H02177511 | 1/1990 |
| JP | 2009026865 | 2/2009 |
| TW | 200947756 | 11/2009 |
| TW | 201005986 | 2/2010 |
| WO | 0248434 | 6/2002 |
| WO | 2007105882 | 9/2007 |

OTHER PUBLICATIONS

"Second Office Action of Related U.S. Appl. No. 14/459,335", dated Aug. 20, 2015, p. 1-p. 33.
"Office Action of Taiwan Related Application, application No. 102129696", dated Jul. 8, 2015, p. 1-p. 6.
"Office Action of Taiwan Counterpart Application", dated Nov. 19, 2014, p. 1-p. 6.
"Third Office Action of Related U.S. Appl. No. 14/459,335", dated Feb. 19, 2016, p. 1-p. 43.
"Office Action of Related U.S. Appl. No. 14/940,175", dated Jun. 28, 2016, p. 1-p. 20.
"Office Action of Related U.S. Appl. No. 14/459,335", dated Jul. 5, 2016, p. 1-p. 43.
"Office Action of China Related Application, application No. 201310028721.9", dated Mar. 15, 2016, p. 1-p. 7.
"Office Action of Taiwan Related Application, application No. 103122543", dated Mar. 24, 2016, p. 1-p. 6.
"Notice of Allowance of Taiwan Counterpart Application", dated Jul. 28, 2016, p. 1-p. 3.
Office Action of CN Related Application, application No. 201410240257.4, dated Dec. 9, 2016, p. 1-p. 8.
"Office Action of Related U.S. Appl. No. 14/940,175," dated Mar. 23, 2017, p. 1-p. 12.
"Office Action of China Counterpart Application," dated Jul. 20, 2017, p1-p5, in which the listed references were cited.

* cited by examiner

SEMICONDUCTOR STRUCTURE

CROSS-REFERENCE TO RELATED APPLICATION

This application is a continuation application of and claims the priority benefit of U.S. prior application Ser. No. 13/917,645, filed on Jun. 14, 2013, now pending, which claims the priority benefit of Taiwan application serial no. 101145835, filed on Dec. 6, 2012. The entirety of each of the above-mentioned patent applications is hereby incorporated by reference herein and made a part of this specification.

BACKGROUND OF THE INVENTION

Field of the Invention

The invention relates to a semiconductor structure. More particularly, the invention relates to a semiconductor structure having grading stress buffer layers.

Description of Related Art

With the progress of semiconductor technologies, a light emitting diode (LED) now has advantages of high luminance, low power consumption, compactness, low driving voltage, being mercury free, and so forth. Therefore, the LED has been extensively applied in the field of displays and illumination. In general, an LED chip is fabricated by using a broad band-gap semiconductor material, such as gallium nitride (GaN). However, in addition to the difference in thermal expansion coefficient and chemical properties, the difference between the lattice constant of GaN and that of a hetero-substrate cannot be ignored. Hence, due to lattice mismatch, GaN grown on the hetero-substrate undergoes lattice dislocation, and the lattice dislocation extends toward a thickness direction of the GaN layer. Further, because of lattice mismatch between GaN and the hetero-substrate, the material of GaN relative to the hetero-substrate will create great structural stress. As the growth thickness becomes thicker, the stress accumulated becomes greater. When exceeding a threshold value, the material layer will be unable to support the stress, and must deform to release the stress. As such, the lattice dislocation not only causes crystal growth defects which reduce the light emitting efficiency of the LED and shortens lifetime, it also can not grow very thick GaN.

SUMMARY OF THE INVENTION

The invention is directed to a semiconductor structure, capable of releasing the stress problem caused by conventional lattice mismatch, and reducing lattice dislocation from extending in a thickness direction.

The invention provides a semiconductor structure, including a silicon substrate, an aluminum nitride layer, and a plurality of grading stress buffer layers. The aluminum nitride layer is disposed on the silicon substrate. The grading stress buffer layers are disposed on the aluminum nitride layer. Each grading stress buffer layer includes a grading layer and a transition layer stacked up sequentially. A chemical formula of the grading layer is $Al_{1-x}Ga_xN$, wherein the x value is increased from one side near the silicon substrate to a side away from the silicon substrate, and $0 \le x \le 1$. A chemical formula of the transition layer is the same as the chemical formula of a side surface of the grading layer away from the silicon substrate. The chemical formula of the transition layer of the grading stress buffer layer furthest away from the silicon substrate is GaN.

In an embodiment of the invention, the thickness of the grading layer of the grading stress buffer layers increase from a side close to the silicon substrate to a side away from the silicon substrate.

In an embodiment of the invention, the thickness of each grading layer ranges from 50 nm to 700 nm.

In an embodiment of the invention, the thickness of the transition layer of the grading stress buffer layers increase from a side close to the silicon substrate to a side away from the silicon substrate.

In an embodiment of the invention, the thickness of each transition layer ranges from 50 nm to 700 nm.

In an embodiment of the invention, the x value of the chemical formula of the transition layer increases as an arithmetic progression.

In an embodiment of the invention, the grading stress buffer layers include 2 to 10 grading stress buffer layers.

In an embodiment of the invention, the semiconductor structure further includes a superlattice structure layer, disposed between the aluminum nitride layer and the plurality of grading stress buffer layers. The superlattice structure layer includes a plurality of aluminum gallium indium nitride structure layers. Each aluminum gallium indium nitride structure layer includes a first aluminum gallium indium nitride layer and a second aluminum gallium indium nitride layer stacked on each other. The chemical formula of the first aluminum gallium indium nitride layers is $Al_sGa_tIn_{(1-s-t)}N$, wherein $0<s<1$, $0<t<1$, and $0<s+t \le 1$. The chemical formula of the second aluminum gallium indium nitride layers is $Al_mGa_nIn_{(1-m-n)}N$, wherein $0<m<1$, $0<n<1$, and $0<m+n \le 1$. When m=s, n≠t, and when n=t, m≠s.

In an embodiment of the invention, the thickness of each aluminum gallium indium nitride structure layer ranges from 5 nm to 500 nm.

In an embodiment of the invention, the thickness of the superlattice structure layer ranges from 20 nm to 5000 nm.

In an embodiment of the invention, the superlattice structure layer includes 5 or more aluminum gallium indium nitride structure layers.

In an embodiment of the invention, the semiconductor structure further includes a superlattice structure layer, disposed between the plurality of grading stress buffer layers. The superlattice structure layer includes a plurality of aluminum gallium indium nitride structure layers. Each aluminum gallium indium nitride structure layer includes a first aluminum gallium indium nitride layer and a second aluminum gallium indium nitride layer stacked on each other. The chemical formula of the first aluminum gallium indium nitride layers is $Al_sGa_tIn_{(1-s-t)}N$, wherein $0<s<1$, $0<t<1$, and $0<s+t \le 1$. The chemical formula of the second aluminum gallium indium nitride layers is $Al_mGa_nIn_{(1-m-n)}N$, wherein $0<m<1$, $0<n<1$, and $0<m+n \le 1$. When m=s, n≠t, and when n=t, m≠s.

In an embodiment of the invention, the thickness of each aluminum gallium indium nitride structure layer ranges from 5 nm to 500 nm.

In an embodiment of the invention, the thickness of the superlattice structure layer ranges from 20 nm to 5000 nm.

In an embodiment of the invention, the superlattice structure layer includes 5 or more aluminum gallium indium nitride structure layers.

Based on the above, since a plurality of grading stress buffer layers are disposed on the aluminum nitride layer of the invention, the amount of gallium can be increased, so as to achieve a GaN layer. As such, the stress generated from the lattice difference between the GaN layer and the silicon substrate can be effectively reduced. In addition, lattice dislocation extending in a thickness direction can also be effectively reduced, improving the overall quality of the semiconductor structure.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

In the description of the following embodiments, when a layer (or film) or a structure is disposed "above" or "below" another substrate, another layer (or film), or another structure, it should be understood that the layer (or film) or the structure can be "directly" located on another substrate, layer (or film), or another structure. Or, the two layers (or films) or structures can have one or more middle layers so as to be "indirectly" disposed on each other. The Examiner can refer to the attached figures for the position of each layer.

Figure 1:
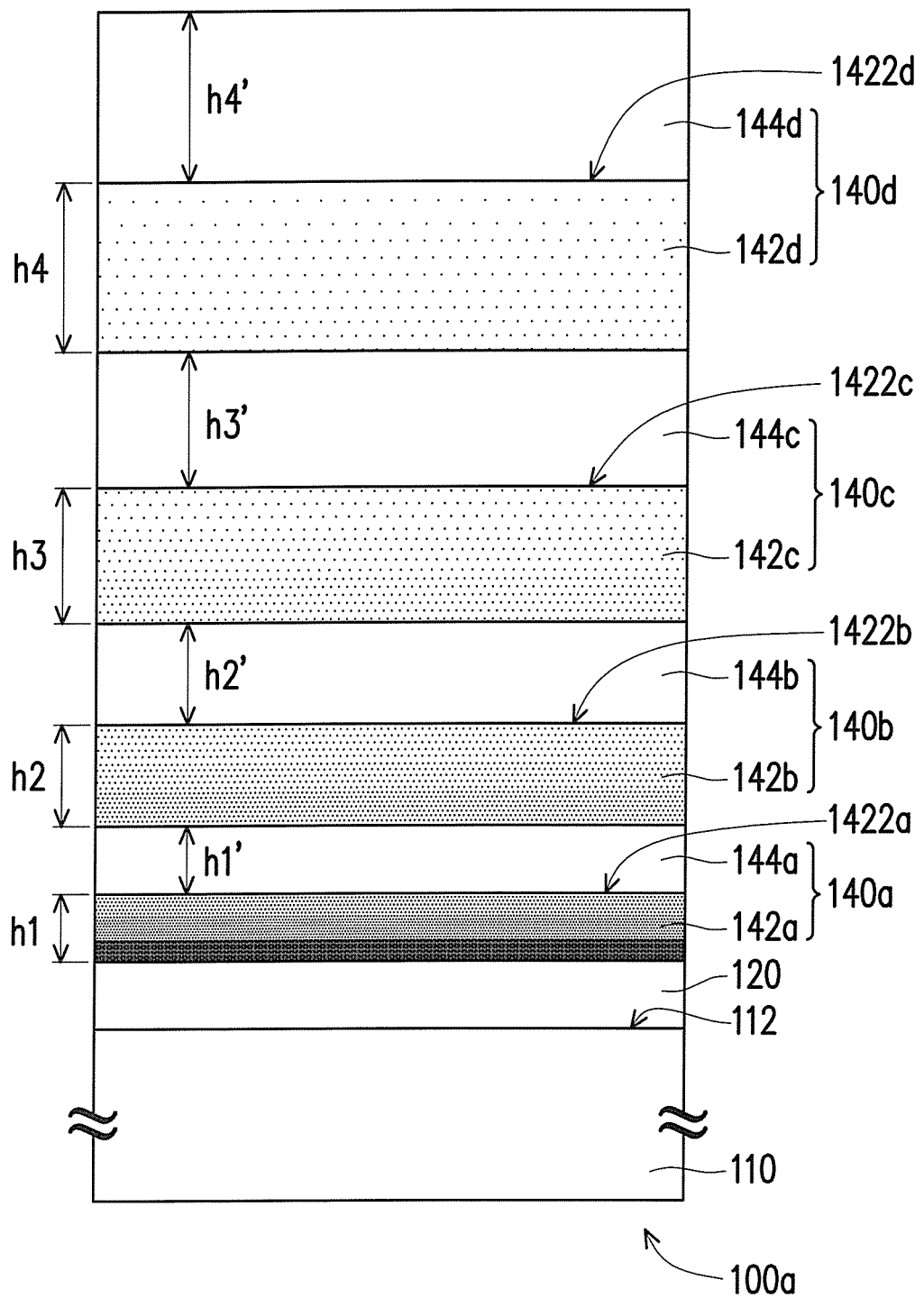
FIG. 1 is a schematic cross-sectional view of a semiconductor structure according to an embodiment of the invention.

FIG. 1 is a schematic cross-sectional view of a semiconductor structure according to an embodiment of the invention. Referring to FIG. 1, in the embodiment, a semiconductor structure 100a includes a silicon substrate 110, an aluminum nitride layer 120, and a plurality of grading stress buffer layers 140a, 140b, 140c, and 140d (FIG. 1 only shows four). The silicon substrate 110 has an upper surface 112. The aluminum nitride layer 120 is disposed on the upper surface 112 of the silicon substrate 110. The grading stress buffer layers 140a, 140b, 140c, and 140d are disposed on the aluminum nitride layer 120. Each grading stress buffer layer 140a (or 140b, 140c, 140d) includes a grading layer 142a (or 142b, 142c, 142d) and a transition layer 144a (or 144b, 144c, 144d) stacked up sequentially. A chemical formula of the grading layers 142a, 142b, 142c, 142d is $Al_{1-x}Ga_xN$, wherein the x value is increased from one side near the upper surface 112 of the silicon substrate 110 to a side away from the upper surface 112 of the silicon substrate 110, and $0 \leq x \leq 1$. Each transition layer 144a (or 144b, 144c, 144d) and a side surface 1422a (or 1422b, 1422c, 1422d) of each grading layer 142a (or 142b, 142c, 142d) furthest away from the silicon substrate is made up of the same elements.

For example, the x value of the chemical formula of the grading layer 142a of the grading stress buffer layer 140a is, for example, between 0 and 0.25. That is to say, the Al amount of the grading layer 142a decreases from a side close to the aluminum nitride layer 120 to a side away from the aluminum nitride layer 120 (i.e. the Al amount decreases from 1 to 0.75). The Ga amount increases from a side close to the aluminum nitride layer 120 to a side away from the aluminum nitride layer 120 (i.e. the Ga amount increases from 0 to 0.25). The transition layer 144a and the side surface 1422a of the grading layer 142a furthest from the silicon substrate 110 are made up of the same elements (i.e. the chemical formula of the transition layer 144a is $Al_{0.75}Ga_{0.25}N$).

Similarly, the x value of the chemical formula of the grading layer 142b of the grading stress buffer layer 140b is, for example, between 0.25 and 0.5. That is to say, the Al amount of the grading layer 142b decreases from a side close to the aluminum nitride layer 120 to a side away from the aluminum nitride layer 120 (i.e. the Al amount decreases from 0.75 to 0.5). The Ga amount increases from a side close to the aluminum nitride layer 120 to a side away from the aluminum nitride layer 120 (i.e. the Ga amount increases from 0.25 to 0.5). The transition layer 144b and the side surface 1422b of the grading layer 142b furthest from the silicon substrate are made up of the same elements (i.e. the chemical formula of the transition layer 144b is $Al_{0.5}Ga_{0.5}N$).

The x value of the chemical formula of the grading layer 142c of the grading stress buffer layer 140c is, for example, between 0.5 and 0.75. That is to say, the Al amount of the grading layer 142c decreases from a side close to the aluminum nitride layer 120 to a side away from the aluminum nitride layer 120 (i.e. the Al amount decreases from 0.5 to 0.25). The Ga amount increases from a side close to the aluminum nitride layer 120 to a side away from the aluminum nitride layer 120 (i.e. the Ga amount increases from 0.5 to 0.75). The transition layer 144c and the side surface 1422c of the grading layer 142c furthest from the silicon substrate are made up of the same elements (i.e. the chemical formula of the transition layer 144c is $Al_{0.25}Ga_{0.75}N$).

The x value of the chemical formula of the grading layer 142d of the grading stress buffer layer 140d is, for example, between 0.75 and 1. That is to say, the Al amount of the grading layer 142d decreases from a side close to the aluminum nitride layer 120 to a side away from the aluminum nitride layer 120 (i.e. the Al amount decreases from 0.25 to 0). The Ga amount increases from a side close to the aluminum nitride layer 120 to a side away from the aluminum nitride layer 120 (i.e. the Ga amount increases from 0.75 to 1). Specifically, the transition layer 144d of the grading stress buffer layer 140d furthest from the silicon substrate 110 and the side surface 1422d of the grading layer 142d furthest from the silicon substrate are made up of the same elements (i.e. the chemical formula of the last transition layer 144d is GaN).

That is to say, the x value (i.e. the gallium amount) of the chemical formula of the transition layers 144a, 144b, 144c, 144d of the grading stress buffer layers 140a, 140b, 140c, 140d increases as an arithmetic progression, and the aluminum amount decreases with a proportional arithmetic progression. Of course, in other embodiments, the x value of the chemical formula of the transition layers 144a, 144b, 144c, 144d can increase without an arithmetic progression, and is not limited thereto.

Furthermore, the thicknesses h1, h2, h3, h4 of the grading layers 142a, 142b, 142c, 142d of the grading stress buffer layers 140a, 140b, 140c, 140d increase from close to an upper surface 112 of the silicon substrate 110 to away from the upper surface 112 of the silicon substrate 110. That is to say, the thickness h1 of the grading layer 142a is less than the thickness h2 of the grading layer 142b. The thickness h2 of the grading layer 142b is less than the thickness h3 of the grading layer 142c. The thickness h3 of the grading layer 142c is less than the thickness h4 of the grading layer 142d. Herein, preferably, the thickness h1 (or h2, h3, h4) of each grading layer 142a (or 142b, 142c, 142d) ranges between 50 nm and 700 nm. It should be noted that with the thicknesses of the grading layers falling within this range, the growth quality is more stable and will be less likely to have defects.

In addition, the thicknesses of the transition layers 144a, 144b, 144c, 144d of the grading stress buffer layers 140a, 140b, 140c, 140d increase from close to an upper surface 112 of the silicon substrate 110 to away from the upper surface 112 of the silicon substrate 110. That is to say, the thickness h1' of the transition layer 144a is less than the thickness h2' of the transition layer 144b. The thickness h2' of the transition layer 144b is less than the thickness h3' of the transition layer 144c. The thickness h3' of the transition layer 144c is less than the thickness h4' of the transition layer 144d. Herein, preferably, the thickness h1' (or h2', h3', h4') of each transition layer 144a (or 144b, 144c, 144d) ranges between 50 nm and 700 nm. It should be noted that with the thicknesses of the transition layers falling within this range, the growth quality is more stable and will be less likely to have defects.

In the semiconductor structure 100a of the embodiment, the grading stress buffer layers 140a, 140b, 140c, 140d are disposed on the aluminum nitride layer 120. The aluminum amount in the transition layers 144a, 144b, 144c, 144d decreases as an arithmetic progression, and the gallium amount increases as an arithmetic progression. The transition layer 144a, 144b, 144c, 144d and the side surface 1422a (or 1422b, 1422c, 1422d) of the grading layer 142a, 142b, 142c, 142d furthest from the silicon substrate 110 are made up of the same aluminum amount and gallium amount. Thus, a GaN layer can be obtained (i.e. transition layer 144d). The grading stress buffer layers 140a, 140b, 140c, 140d can be used to reduce the stress caused by the expansion coefficient and the lattice difference between the GaN layer (i.e. the transition layer 144d) and the silicon substrate 110. Besides the grading stress buffer layers 140a, 140b, 140c, 140d having the function of relieving stress, conventional lattice dislocation extending in a thickness direction can also be reduced, improving the overall quality of the semiconductor structure 100a.

Of course, the number of the grading stress buffer layers 140a, 140b, 140c, 140d shown are exemplary. One skilled in the art can adjust the amount of aluminum and gallium and increase the number of grading stress buffer layers. If the x value (i.e. the gallium amount) increases by an arithmetic progression of 0.1, the number of grading stress buffer layers can be 10. This way, the stress caused by the expansion coefficient and the lattice difference between the GaN layer (i.e. the transition layer 144d) and the silicon substrate 110 can be reduced; details are not repeated herein.

It is noted that the following embodiment uses the same reference numerals and partial content of the previous embodiment. The same reference numerals represent similar components, and repeated description is omitted. Those not described in the following embodiment can be referred to in the above embodiment.

Figure 2:
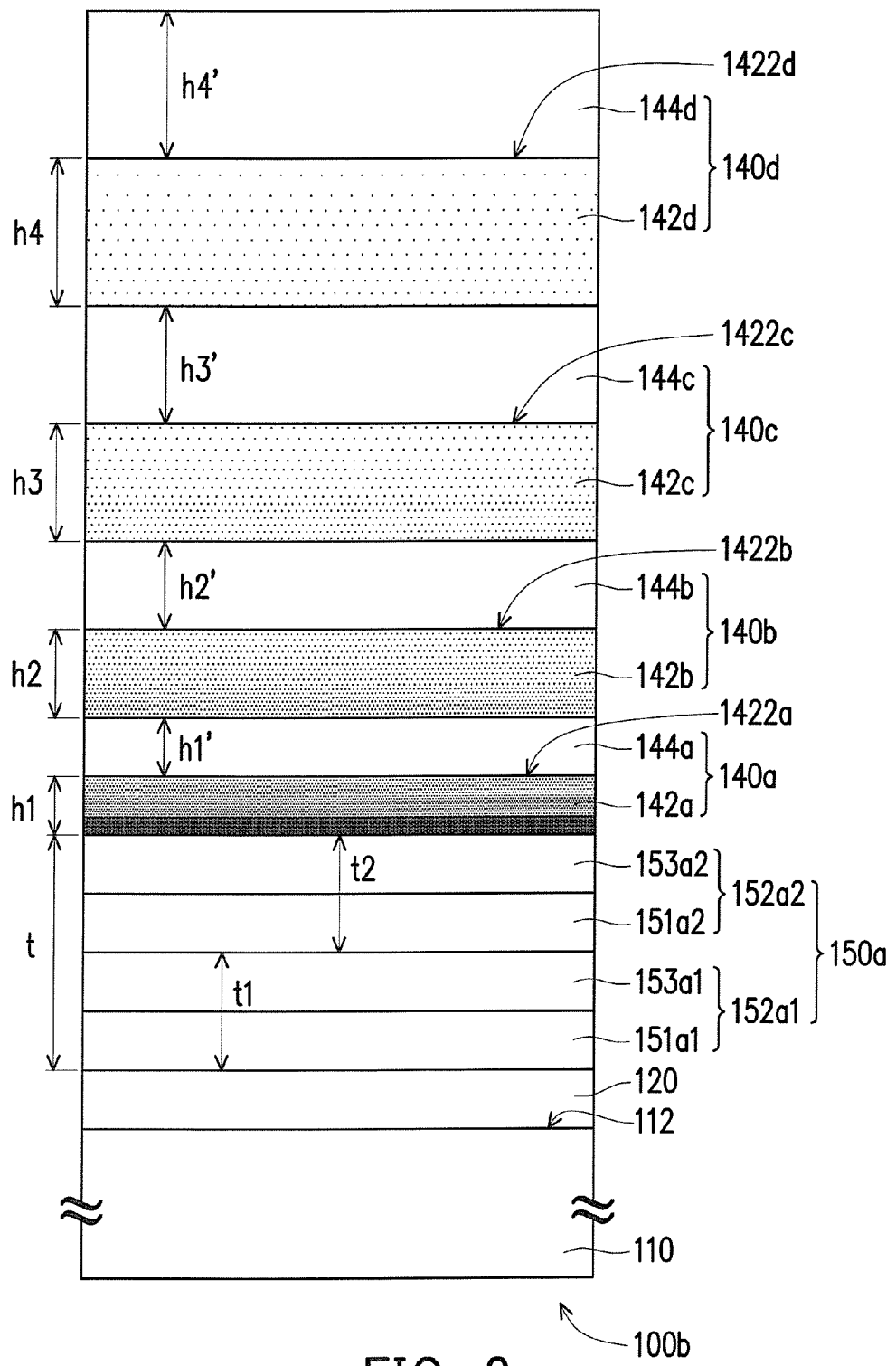
FIG. 2 is a schematic cross-sectional view of a semiconductor structure according to another embodiment of the invention.

FIG. 2 is a schematic cross-sectional view of a semiconductor structure according to another embodiment of the invention. Referring to FIG. 2, the semiconductor structure 100b of the embodiment is similar to the semiconductor structure 100a of FIG. 1. The difference between the two is that the semiconductor structure 100b of the embodiment further includes a superlattice structure layer 150a. The superlattice structure layer 150a is disposed between the aluminum nitride layer 120 and the grading stress buffer layers 140a, 140b, 140c, 140d.

In detail, the superlattice structure layer 150a is disposed between the aluminum nitride layer 120 and the grading stress buffer layer 140a. The super lattice structure layer 150a includes a plurality of aluminum gallium indium nitride structure layers 152a1, 152a2 (FIG. 2 only shows two). Each aluminum gallium indium nitride structure layer 152a1 (or 152a2) includes a first aluminum gallium indium nitride layer 151a1 (or 151a2) and a second aluminum gallium indium nitride layer 153a1 (or 153a2) stacked on each other. The chemical formula of the first aluminum gallium indium nitride layers 151a1, 151a2 is $Al_sGa_tIn_{(1-s-t)}N$, wherein $0<s<1$, $0<t<1$, and $0<s+t\leq1$. The chemical formula of the second aluminum gallium indium nitride layers 153a1, 153a2 is $Al_mGa_nIn_{(1-m-n)}N$, wherein $0<m<1$, $0<n<1$, and $0<m+n\leq1$. When m=s, n≠t, and when n=t, m≠s. That is to say, the ratio of the elements of the first aluminum gallium indium nitride layer 151a1 (or 151a2) and the second aluminum gallium indium nitride layer 153a1 (or 153a2) are not exactly the same.

For example, the chemical formula of the first aluminum gallium indium nitride layer 151a1 of the aluminum gallium indium nitride structure layer 152a1 is $Al_{0.3}Ga_{0.2}In_{0.5}N$, and the chemical formula of the second aluminum gallium indium nitride layer 153a1 is $Al_{0.3}Ga_{0.4}In_{0.3}N$. In addition, the thickness t1, t2 of each aluminum gallium indium nitride structure layer 152a1, 152a2 ranges, for example, from 5 nm to 500 nm. The thickness t of the superlattice structure 150a, for example, ranges from 20 nm to 5000 nm. Preferably, the number of aluminum gallium indium nitride structure layers 152a1, 152a2 is at least five. Because the superlattice structure 150a is disposed between the aluminum nitride layer 120 and the grading stress buffer layer 140a, the design can help in reducing the stress caused by the expansion coefficient and the lattice difference between the grading stress buffer layer 140a and the silicon substrate 110. In addition, the dislocation formed before the superlattice structure 150a is grown can be prevented, so that the dislocation is unable to continue to grow. This further improves the quality of the semiconductor structure 100b.

Figure 3:
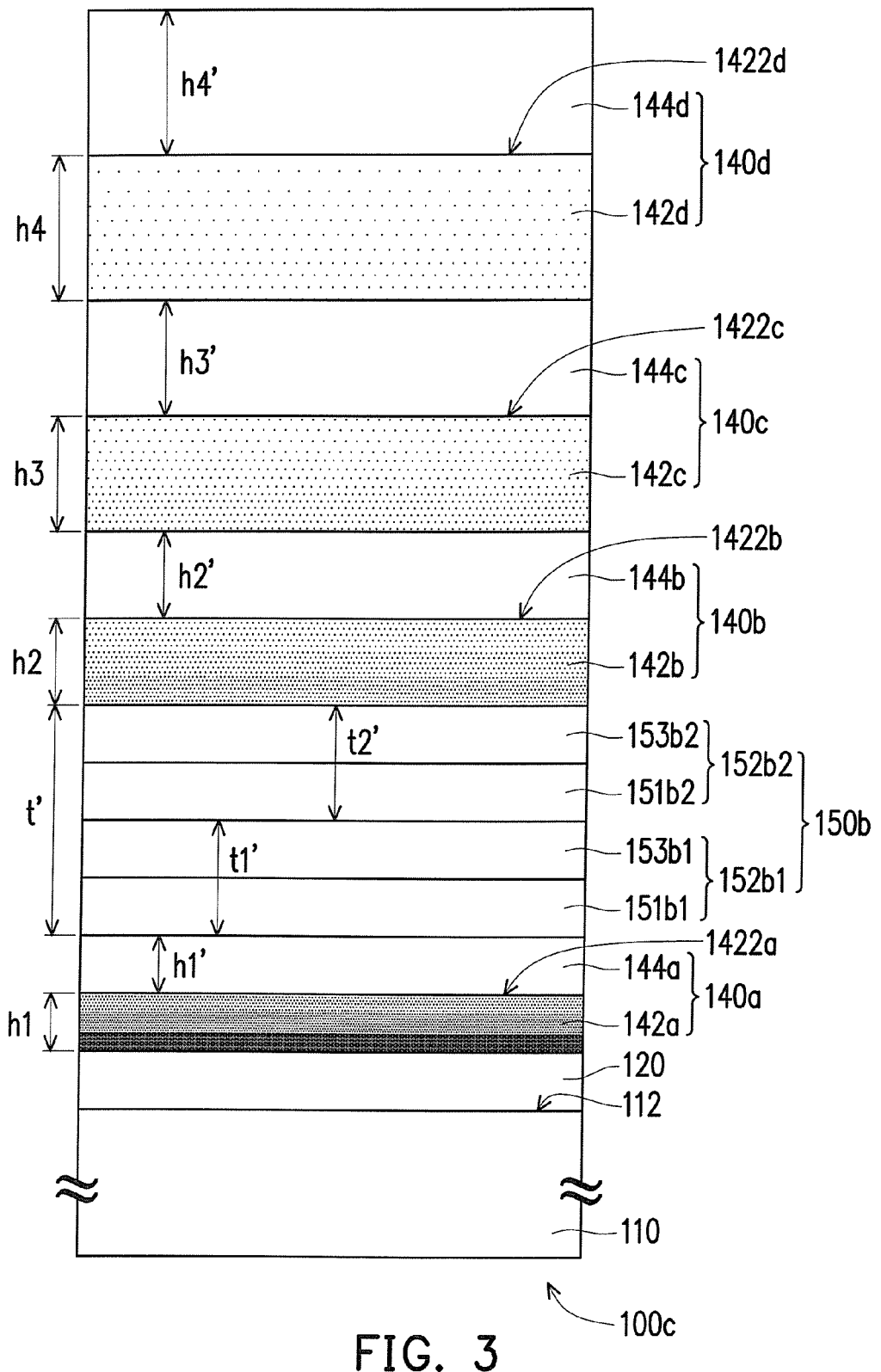
FIG. 3 is a schematic cross-sectional view of a semiconductor structure according to yet another embodiment of the invention.

FIG. 3 is a schematic cross-sectional view of a semiconductor structure according to yet another embodiment of the invention. Referring to FIG. 3, the semiconductor structure 100c of the embodiment is similar to the semiconductor structure 100a of FIG. 1. The difference between the two is that the semiconductor structure 100c of the embodiment further includes a superlattice structure layer 150b. The superlattice structure layer 150b is disposed between the grading stress buffer layer 140a and the grading stress buffer layer 140b. The superlattice structure layer 150b includes a plurality of aluminum gallium indium nitride structure layers 152b1, 152b2. Each aluminum gallium indium nitride structure layer 152b1 (or 152b2) includes a first aluminum gallium indium nitride layer 151b1 (or 151b2) and a second aluminum gallium indium nitride layer 153b1 (or 153b2) stacked on each other. The chemical formula of the first aluminum gallium indium nitride layers 151b1, 151b2 is $Al_sGa_tIn_{(1-s-t)}N$, wherein $0<s<1$, $0<t<1$, and $0<s+t\leq1$. The chemical formula of the second aluminum gallium indium nitride layers 153b1, 153b2 is $Al_mGa_nIn_{(1-m-n)}N$, wherein $0<m<1$, $0<n<1$, and $0<m+n\leq1$. When m=s, n≠t, and when n=t, m≠s. That is to say, the ratio of the elements of the first aluminum gallium indium nitride layer 151b1 (or 151b2) and the second aluminum gallium indium nitride layer 153b1 (or 153b2) are not exactly the same.

For example, the chemical formula of the first aluminum gallium indium nitride layer 151b1 of the aluminum gallium indium nitride structure layer 152b1 is $Al_{0.3}Ga_{0.2}In_{0.5}N$, and the chemical formula of the second aluminum gallium indium nitride layer 153b1 is $Al_{0.3}Ga_{0.4}In_{0.3}N$. In addition, the thickness t1', t2' of each aluminum gallium indium nitride structure layer 152b1, 152b2 ranges, for example, from 5 nm to 500 nm. The thickness t' of the superlattice structure 150b, for example, ranges from 20 nm to 5000 nm. Preferably, the number of aluminum gallium indium nitride structure layers 152b1, 152b2 is at least five. Because the superlattice structure 150a is disposed between the adjacent grading stress buffer layers 140a, 140b, the design can help in reducing the stress caused by the expansion coefficient and the lattice difference between the grading stress buffer layers 140a, 140b. In addition, the dislocation formed before the superlattice structure 150b is grown can be prevented, so that the dislocation is unable to continue to grow. This further improves the quality of the semiconductor structure 100c.

It should be noted that the invention does not limit the position and type of the superlattice structures 150a, 150b even though the superlattice structures 150a, 150b have been to described to be located between the aluminum nitride layer 120 and the grading stress buffer layer 140a, or, between the grading stress buffer layer 140a and the grading stress buffer layer 140b. In other embodiments not shown, the superlattice structure can be disposed between any two neighboring layers of the grading stress buffer layers 140a, 140b, 140c, 140d; for example, between the grading layer 142a and the transition layer 144a, or the grading layer 142c and the transition layer 144c. Or, the superlattice structures can at the same time be disposed between the aluminum nitride layer 120 and the grading stress buffer layer 140a, and between any two neighboring layers of the grading stress buffer layers 140a, 140b, 140c, 140d. One skilled in the art can adjust or increase the design of the superlattice structures accordingly, so as to satisfy reducing of dislocation. This is still a part of the technical proposal of the invention and does not depart from the protection scope of the invention.

To sum up, since a plurality of grading stress buffer layers are disposed on the aluminum nitride layer of the invention, the amount of gallium can be increased, so as to achieve a GaN layer. Therefore, the stress generated from the lattice difference between the GaN layer and the silicon substrate can be effectively reduced. In addition, lattice dislocation extending in a thickness direction can also be effectively reduced, improving the overall quality of the semiconductor structure.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A semiconductor structure, comprising:
   an aluminum nitride layer; and
   a plurality of grading stress buffer layers disposed on the aluminum nitride layer, wherein a chemical formula of the plurality of grading stress buffer layers is $Al1-xGaxN$, wherein an x value is increased from a side near the aluminum nitride layer along a direction away from the aluminum nitride layer, and $0<=x<=1$, and the x value is increased in each grading stress buffer layer and is continuously increased between two adjacent grading stress buffer layers; wherein each of the grading stress buffer layers includes a grading layer and a transition layer stacked up sequentially, and a first grading layer of a first grading stress buffer layer contacted the aluminum nitride layer; wherein the chemical formula of each of the grading layers is $Al1-xGaxN$, and the x value is continuously increased; wherein the chemical formula of each of the transition layers has a constant x value and is the same to the chemical formula of a side surface of each of the corresponding grading layers which is furthest away from the aluminum nitride layer, and the chemical formula of the last transition layer of the last grading stress buffer layer furthest away from the aluminum nitride layer is GaN, and a thickness of each of the grading layers of the grading stress buffer layers increases from a side close to the aluminum nitride layer along a direction away from the aluminum nitride layer,
   wherein a concentration of gallium in the overall grading layers continuously increases from a side surface of the grading layer closest to the aluminum nitride layer to side surface of the grading layer furthest away from the aluminum nitride layer, and a concentration of gallium in the overall transition layers stepwisely increases from a side surface of the transition layer closest to the aluminum nitride layer to a side surface of the transition layer furthest away from the aluminum nitride layer.

2. The semiconductor structure as claimed in claim 1, wherein the thickness of each of the grading layers is between 50 run and 700 nm.

3. The semiconductor structure as claimed in claim 1, wherein a thickness of each of the transition layers of the grading stress buffer layers increase from a side close to the aluminum nitride layer to a direction away from the aluminum nitride layer.

4. The semiconductor structure as claimed in claim 3, wherein the thickness of each of the transition layers is between 50 nm and 700 nm.

5. The semiconductor structure as claimed in claim 1, wherein the x value of the chemical formula of the transition layers increases as an arithmetic progression.

6. The semiconductor structure as claimed in claim 1, wherein a number of the grading stress buffer layers is 2 to 10 grading stress buffer layers.

7. The semiconductor structure as claimed in claim 1, further comprising:
   a substrate, wherein the aluminum nitride layer is disposed on the substrate.

8. A semiconductor structure, comprising:
   an aluminum nitride layer; and
   a plurality of grading stress buffer layers disposed on the aluminum nitride layer, wherein a chemical formula of the plurality of grading stress buffer layers is $Al1-xGaxN$, wherein an x value is increased from a side near the aluminum nitride layer along a direction away from the aluminum nitride layer, and $0<=x<=1$, and the x value is increased in each grading stress buffer layer and is continuously increased between two adjacent grading stress buffer layers; wherein each of the grading stress buffer layers includes a grading layer and a transition layer stacked up sequentially, and a first grading layer of a first grading stress buffer layer contacted the aluminum nitride layer; wherein the chemical formula of each of the grading layers is $Al1-xGaxN$, and the x value is continuously increased; wherein the chemical formula of each of the transition layers has a constant x value and is the same to the chemical formula of a side surface of each of the corresponding grading layers which is furthest away from the aluminum nitride layer, and the chemical formula of the last transition layer of the last grading stress buffer layer furthest away from the aluminum nitride layer is GaN, and a thickness of each of the transition layers of the grading stress buffer layers increases from a side close to the aluminum nitride layer along a direction away from the aluminum nitride layer, wherein a concentration of gallium in the overall grading layers continuously increases from a side surface of the grading layer closest to the aluminum nitride layer to side surface of the grading layer furthest away from the aluminum nitride layer, and a concentration of gallium in the overall transition layers stepwisely increases from a side surface of the transition layer closest to the aluminum nitride layer to a side surface of the transition layer furthest away from the aluminum nitride layer.

9. The semiconductor structure as claimed in claim 8, wherein the thickness of each of the grading layers is between 50 nm and 700 nm.

10. The semiconductor structure as claimed in claim 8, wherein the thickness of each of the transition layers is between 50 nm and 700 nm.

11. The semiconductor structure as claimed in claim 8, wherein the x value of the chemical formula of the transition layers increases as an arithmetic progression.

12. The semiconductor structure as claimed in claim 8, wherein a number of the grading stress buffer layers is 2 to 10 grading stress buffer layers.

13. The semiconductor structure as claimed in claim 8, further comprising:
a substrate, wherein the aluminum nitride layer is disposed on the substrate.

14. A semiconductor structure, comprising:
an aluminum nitride layer; and
a plurality of grading stress buffer layers disposed on the aluminum nitride layer, wherein a chemical formula of the plurality of grading stress buffer layers is Al1-xGaxN, wherein an x value is increased from a side near the aluminum nitride layer along a direction away from the aluminum nitride layer, and $0<=x<=1$, and the x value is increased in each grading stress buffer layer and is continuously increased between two adjacent grading stress buffer layers; wherein each of the grading stress buffer layers includes a grading layer and a transition layer stacked up sequentially, and a first grading layer of a first grading stress buffer layer contacted the aluminum nitride layer; wherein the chemical formula of each of the grading layers is Al1-xGaxN, and the x value is continuously increased; wherein the chemical formula of each of the transition layers has a constant x value and is the same to the chemical formula of a side surface of each of the corresponding grading layers which is furthest away from the aluminum nitride layer, and the chemical formula of the last transition layer of the last grading stress buffer layer furthest away from the aluminum nitride layer is GaN, wherein the thickness of each of the grading layers is between 50 nm and 700 nm, wherein a concentration of gallium in the overall grading layers continuously increases from a side surface of the grading layer closest to the aluminum nitride layer to side surface of the grading layer furthest away from the aluminum nitride layer, and a concentration of gallium in the overall transition layers stepwisely increases from a side surface of the transition layer closest to the aluminum nitride layer to a side surface of the transition layer furthest away from the aluminum nitride layer.

15. The semiconductor structure as claimed in claim 14, wherein a thickness of each of the grading layers of the grading stress buffer layers increase from a side close to the aluminum nitride layer to a direction away from the aluminum nitride layer.

16. The semiconductor structure as claimed in claim 14, wherein a thickness of each of the transition layers of the grading stress buffer layers increase from a side close to the aluminum nitride layer to a direction away from the aluminum nitride layer.

17. The semiconductor structure as claimed in claim 16, wherein the thickness of each of the transition layers is between 50 nm and 700 nm.

18. The semiconductor structure as claimed in claim 14, wherein the x value of the chemical formula of the transition layers increases as an arithmetic progression.

19. The semiconductor structure as claimed in claim 14, wherein a number of the grading stress buffer layers is 2 to 10 grading stress buffer layers.

20. The semiconductor structure as claimed in claim 14, further comprising:
a substrate, wherein the aluminum nitride layer is disposed on the substrate.

* * * * *